United States Patent
Grodnensky et al.

(12) 
(10) Patent No.: US 6,664,121 B2
(45) Date of Patent: Dec. 16, 2003

(54) METHOD AND APPARATUS FOR POSITION MEASUREMENT OF A PATTERN FORMED BY A LITHOGRAPHIC EXPOSURE TOOL

(75) Inventors: Ilya Grodnensky, Foster City, CA (US); Steve Slonaker, San Mateo, CA (US)

(73) Assignee: Nikon Precision, Inc., Belmont, CA (US)

( * ) Notice: Subject to any disclaimer, the term of this patent is extended or adjusted under 35 U.S.C. 154(b) by 0 days.

(21) Appl. No.: 10/150,159

(22) Filed: May 20, 2002

(65) Prior Publication Data

US 2003/0215965 A1 Nov. 20, 2003

(51) Int. Cl.[7] .................. H01L 21/76; H01L 21/66; H01L 23/58; G01B 11/14
(52) U.S. Cl. .................. 438/16; 438/401; 438/462; 257/798; 356/625
(58) Field of Search ................... 438/401, 462, 438/16, 15, 14, 637–39; 430/30; 356/625; 257/798

(56) References Cited

U.S. PATENT DOCUMENTS

| | | | | |
|---|---|---|---|---|
| 4,860,374 A | * | 8/1989 | Murakami et al. | 382/151 |
| 6,094,256 A | * | 7/2000 | Grodnensky et al. | 355/77 |
| 6,316,328 B1 | * | 11/2001 | Komuro | 438/401 |
| 6,449,031 B1 | * | 9/2002 | Grodnensky et al. | 355/77 |
| 6,538,753 B2 | * | 3/2003 | Grodnensky et al. | 356/625 |

OTHER PUBLICATIONS

J. Kirk; "Review of Photoresist Based Lens Evaluation Methods"; Proceedings of SPIE vol. 4000 (2000).
B.H. Nam et al.; "Lens Aberration Measurement and Analysis Using a Novel Pattern"; Proceedings of SPIE vol. 4346 (2001); pp. 1290–1299.
J. P. Kirk & S. Schank; "Detection of Focus and Spherical Aberration by Use of a Phase Grating"; Proceedings of SPIE vol. 4346 (2001); pp. 1355–1361.
H. Nomura; "New Phase Shift Gratings for Measuring Aberrations"; Proceedings of SPIE vol.4346 (2001); pp. 25–35.
J. Kye et al.; "Linewidth Assymmetry Study to Predict Aberration in Lithographic Lenses"; Proceedings of SPIE vol. 4346 (2001); pp. 1280–1286.
G. Kunkel et al.; "How Lens Aberrations Influence Lithographic Imaging and How to Reduce Their Effects"; Proceedings of SPIE vol. 4346 (2001); pp. 1404–1415.
N. Seong et al; "Optimal Lens Assignment Through Measured Aberrations"; Proceedings of SPIE vol. 4346 (2001); pp. 1–7.
Q. Wu et al; "Optimization of Segmented Alignment Marks for Advanced Semiconductor Fabrication Processes"; Proceedings of SPIE vol. 4344 (2001); pp. 234–244.

* cited by examiner

*Primary Examiner*—Craig Thompson
(74) *Attorney, Agent, or Firm*—Whitham, Curtis & Christofferson, PLC.

(57) ABSTRACT

Variation in position of test marks formed of overlapping exposed features imaged by an imaging structure such as that of a lithography tool are characterized at high speed and with extremely high accuracy by imaging test marks formed in resist or on a target or wafer by a lithographic process, collecting irradiance distribution data and fitting a mathematical function to respective portions or regions of output data corresponding to a test mark of a test mark pattern such as respective maxima or minima regions or other regions of the irradiance distribution data to determine actual location and shift of position of respective patterns of test marks. Metrology fields are formed of patterns of test marks on test wafers or production wafers preferably including a critical dimension exposed at different focus distances and/or illumination conditions to capture position/aberration data for the imaging structure. The imaging structure can then be adjusted or corrected to minimize or eliminate aberrations of performance of the imaging structure or the performance on a complete lithographic process and/or to achieve overlay positioning with high accuracy and minimal requirements for wafer space.

30 Claims, 6 Drawing Sheets

METHOD AND APPARATUS FOR POSITION MEASUREMENT OF A PATTERN FORMED BY A LITHOGRAPHIC EXPOSURE TOOL

BACKGROUND OF THE INVENTION

1. Field of the Invention

The present invention generally relates to characterization of lithographic exposures and, more particularly, to measurement of relative position of marks or patterns formed by a lithographic tool, especially for analysis and possible correction and/or compensation of aberrations in the lithographic tool and/or precorrection of exposure patterns.

2. Description of the Prior Art

It has been recognized that formation of electrical elements (e.g. transistors, capacitors, interconnects and the like) of integrated circuits at smaller sizes and increased density provides benefits in both performance and functionality. Increased proximity of devices reduces signal propagation time and increases noise immunity while increased numbers of electrical elements on a chip of a given size allow increased circuit complexity and additional signal processing functions to be provided. Improved economy of manufacture also generally results from increased integration density since more electrical elements can be simultaneously formed by a given process.

While semiconductor device designs and the processes for their formation have become highly sophisticated in recent years and many self-aligned processes are known for forming various semiconductor structures at dimensions smaller than lithographic resolution, at least one lithographic process is required for the formation of any active or passive electrical element in order to define its location and its basic dimensions. A lithographic process includes the exposure of a resist with some form of energy (e.g. light, charged particles, x-rays, etc.) to which the resist is sensitive in a pattern which is subsequently developed to remove selected areas of the resist to allow processes to be selectively carried out where resist has been removed. Therefore, the quality of the exposure of the resist is of paramount importance to the formation of integrated circuits in accordance with a given design.

Various techniques are known and have been used to evaluate lithographic exposures and each has become substantially obsolete, in turn, as increased integration density and reduced size of electrical elements has required increased precision of measurement of a lithographically produced pattern. At the present time, the minimum feature size regimes of interest and the pattern fidelity which must be produced require an accuracy which exceeds that which can be achieved by direct inspection such as with an optical microscope. Further, the required image fidelity necessitates an extremely high degree of analysis and correction of the imaging capability or behavior of the imaging structure of the lithographic tool, particularly since features must be both properly sized and properly located throughout the lithographic exposure field. Aberrations cause changes in dimensions, shape and location of features of an intended pattern as a function of focus while flatness of the image field at the target is not assured.

Therefore, to obtain adequate pattern fidelity for fabrication of integrated circuits at current and foreseeable minimum feature size regimes requires capture of a large volume of data which must be analyzed to fully characterize and possibly correct aberrations in the behavior of the imaging structure of a lithographic tool. Not only is the required accuracy beyond that of known measurement techniques, as alluded to above, but the volume of data of such accuracy is far beyond the capacity of known techniques to capture in an economically acceptable amount of time. Further, it is desirable to not only capture and characterize the features produced in a lithographic resist by the imaging exposure but the actual features produced by lithographic processes performed in accordance with a patterned resist must also be adequately accurate. However, current and foreseeable minimum feature sizes are difficult if not impossible to resolve, much less measure using visible light. Accordingly, commonly applied image measurement techniques limit the density of integration which can be achieved.

Current designs of integrated circuits generally comprise many layers; a number of which may require one or more lithographic processes. For example, several metallization layers are usually applied in order to make connections to devices such as transistors formed on the chip, often through vias which must be formed by a lithographic exposure. In very densely integrated structures such as memories, it is also common to form a portion of the transistors or other devices using the connection, itself, such as the bit line or word line forming the gates of a plurality of transistors. In either case or other circumstances, the electrical properties of the devices may be severely affected by the alignment of a lithographic exposure with another, prior, exposure and structures formed in accordance therewith.

Such alignment, often referred to as "overlay", is generally performed by manual adjustment using automated optical microscopes in accordance with alignment marks placed on the wafer in regions where chips are not formed. These marks generally must be relatively large in order to be easily observed and thus require valuable space on the chips and reducing the number of chips that can be manufactured from a single wafer. Further, the size of the marks limits the capture of appropriate information relevant to resolution and accuracy of the alignment process with respect to much smaller features and CDs. Thus, the alignment process, as currently performed, limits the uniformity of electrical properties of integrated circuits from wafer to wafer. Moreover, the overlay problem is compounded by aberrations in the exposure and substantially correct alignment a one or more locations on the wafer does not guarantee proper alignment across the entire exposure field particularly when the alignment or registration marks are located a substantial distance from the elements on the chips, as is generally the current practice.

Additionally, the size of the alignment marks are generally not comparable to the size of features to be formed and there is, for that reason, no assurance that the overlay alignment will be of sufficient accuracy or resolution to properly form the devices in the design. In a broader sense, the optimum performance of a lithographic exposure tool or process cannot realistically be achieved using metrology features which are not of comparable dimensions and spacings to the features of the integrated circuit design to be produced.

SUMMARY OF THE INVENTION

To extend position measurement capability to support, for example, manufacture of current and foreseeable integrated circuit designs, the invention provides a measurement technique and apparatus for measurement of relative location of extremely fine and potentially closely spaced features of critical dimensions corresponding to minimum feature size regimes of interest produced by a lithographic exposure tool.

Further, the invention provides a technique and apparatus for characterization of the performance of a lithographic exposure tool and the true performance of an overall lithographic process using features comparable dimensions to a given integrated circuit design. The invention can also be applied to automate and increase accuracy of overlay processes for multiple lithographic exposures and processes at resolution equal to that required for any given integrated circuit design at any minimum feature size regime. By doing so, the invention also supports an overlay accuracy of a very small fraction of the minimum feature size such that wafer to wafer and chip to chip variation in electrical properties of individual elements of the integrated circuit can be avoided, while reducing the chip space required for alignment or registration marks and even the current practice of placement on scribe or dicing lines, where possible, that are close to the elements to be formed and effectively require no wafer space since only portions of the wafer consumed when chips are separated may be used.

In order to accomplish these meritorious functions of the invention, a method for measuring position of features corresponding to a lithographic exposure is provided including steps of forming marks on a surface, imaging the marks to a sensor array to derive an output signal representing image intensity at respective locations across the sensor array, and fitting a mathematical function to respective portions of the output signal corresponding to images of the marks to determine a location of respective ones of the marks.

In accordance with another object of the invention, an apparatus for measuring placement or relative placement of image features by the imaging structure of a lithographic exposure tool is provided comprising a sensor device for developing an output signal representing a distribution of energy from a test mark pattern, and a processor for fitting a mathematical function to respective portions of the output signal corresponding to a test mark of the test mark pattern to determine a location of a test mark.

In accordance with a further aspect of the invention, a method of producing chips on a wafer using a lithographic exposure is provided including steps of forming marks defined by overlapping exposed features on said wafer, imaging the marks to a sensor array to derive an output signal representing image intensity at respective locations across the sensor array, fitting a mathematical function to respective portions of the output signal corresponding to images of the marks to determine a location of respective ones of the marks, and adjusting an imaging structure of a lithographic tool for making a lithographic exposure.

In accordance with yet another aspect of the invention, a semiconductor wafer is provided including a semiconductor integrated circuit pattern formed thereon including features having a first critical dimension, and a plurality of test field patterns having test marks including features having a second critical dimension approximating or being representative of the first critical dimension.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
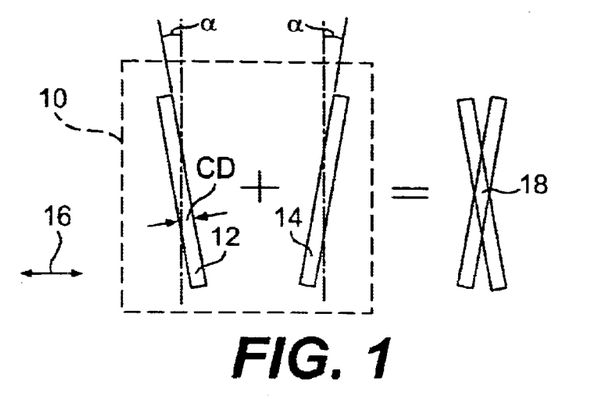
FIG. 1 is a diagram illustrating the exposure of mark features in accordance with a preferred form of the invention.

Referring now to the drawings, and more particularly to FIG. 1, there is shown a preferred imaging technique for forming a preferred type of mark for the practice of the invention. This type of mark and this technique of its formation is disclosed in U.S. Pat. No. 6,094,256 and U.S. patent application Ser. No. 09/861,541, both assigned to the assignee of the present application and both being hereby fully incorporated by reference herein. This type of mark and the technique of its formation are preferred largely because of the simplicity and repeatability thereof as well as the ease and consistency of extraction of information therefrom. However, it should be appreciated that the technique of such data extraction differs substantially in the patent, the patent application and the present invention, depending on the parameter of interest.

Specifically, U.S. Pat. No. 6,094,256, however, teaches use of a measurement of a length much larger than the critical dimension (embodied in the width of an exposed line, as will be discussed in greater detail below) in order to provide an indirect measurement of critical dimension width. As disclosed therein, partial exposures of parallel line patterns (where the critical dimension, CD, is line width) are made with the patterns displaced through a small angle between partial exposures. This technique results in an array pattern of small parallelograms or rhombus shapes (depending on whether the CD of the lines used to form the mark are different or identical, respectively) being exposed and developed. The major dimension, L, of the shape between the most widely separated points of the rhombus or parallelogram (hereinafter sometimes referred to as the major, longer or greater diagonal) is related to the critical dimension, CD, by the angle change between the partial exposures in accordance with the equation $L \propto CD/\sin \alpha$. Since $\sin \alpha$ is very small at small angles, $\alpha$, CD is effectively multiplied in the measurement of L. Thus, by choosing a suitably small angle between exposures or an appropriately tapered pattern, a length dimension much larger than the critical width dimension can be measured and a measurement of the critical dimension calculated from that length. In contrast, the measured quantity in U.S. patent application Ser. No. 09/861,541 is the area of a mark determined by total reflectivity of possibly broadband light as an indirect measurement of the critical dimension embodied in the mark.

It should also be appreciated that measurements of critical dimensions require only representative measurements to detect changes in the critical dimensions in different areas of the field and thus, in the context of integrated circuit manufacture, can be limited to a few dozen to a few hundred measurements per chip. The number of measurements of positional variation sufficient to characterize the aberrations of the imaging structure of a lithographic tool for analysis and correction is often several orders of magnitude larger. Therefore, the invention must support rapid and extremely accurate determination of position of marks.

The preferred mark is produced by an exemplary reticle or portion thereof 10 depicted in plan view in FIG. 1. The reticle 10 includes two features 12, 14 in the form of lines having a width preferably equal to the critical dimension, CD, of interest and oriented at a slight angle to each other so that they may be superimposed by movement of the reticle stage. A different CD may be represented in each respective feature. The length of these marks is essentially arbitrary but should be long enough to insure that overlapping exposures can be obtained without imaging an end of either feature on the other feature within the reticle stage positioning accuracy but short enough to avoid significant position shift along the long axis of the resulting mark during superposition and/or encompassing significant change in aberration along the length of either feature.

These features may be either effectively transparent or opaque (depending on whether a positive or negative imaging response resist is utilized) and the structure thereof is not critical to the practice of the invention but need only be appropriate to the exposure energy or medium for which the exposure tool is designed. For example, for a charged particle beam tool, the features (or surrounding area) may be apertures through the reticle structure or apertures only in a scattering material such as a high atomic weight metal on a silicon substrate. For short wavelength light exposure tools, the features nay include phase shift enhancement features appropriate to the critical dimension to be exposed which are well-understood in the art as long as significantly differing aberrations are not spatially encompassed.

These features are preferably formed to extend at a small angle α to each other which is not critical to the successful practice of the invention. In general, angle α should be chosen to be as small as possible consistent with avoiding a significant degree of instability of the tips of the rhombus shaped mark to be generated therewith and avoiding encompassing a significant change in aberration along the long axis of a mark produced by the superposition of exposures. Angles as small as 1° have been found to provide reliable and consistent results with current resists. It is to be expected that with resists of reduced thickness, smaller angles (e.g. 0.5°) would be reliable, as well. At such small angles, angle α is preferably provided in the feature placement on the reticle itself to assure simplicity of use by indexing in a single direction, without rotation of the reticle, but may also be provided by rotation of the reticle or other expedients as long as the rotation can be performed consistently.

The test mark in accordance with the invention is preferably formed by two overlapping partial exposures, preferably in the same manner as disclosed in the above-incorporated U.S. Pat. No. 6,094,256. That is, an exposure of one of features 12 and 14 (each of which may embody any desired critical dimension, CD, in the same manner as for measurement of CD by area as disclosed in the above-incorporated U.S. patent application) is made and the wafer or the reticle or both indexed relative to each other in the direction indicated by double arrow 16 of FIG. 1 and a second partial exposure made such that portions of features 12 and 14 overlap to form a rhombus shaped image which results in mark 18 of generally rhombus or parallelogram shape. Further, in accordance with a preferred method of practicing the invention, the marks are formed in spatially separated metrology fields at different focus, illumination sigma, etc. in order to obtain additional data by which aberrations in the imaging structure can be characterized.

Figure 2:
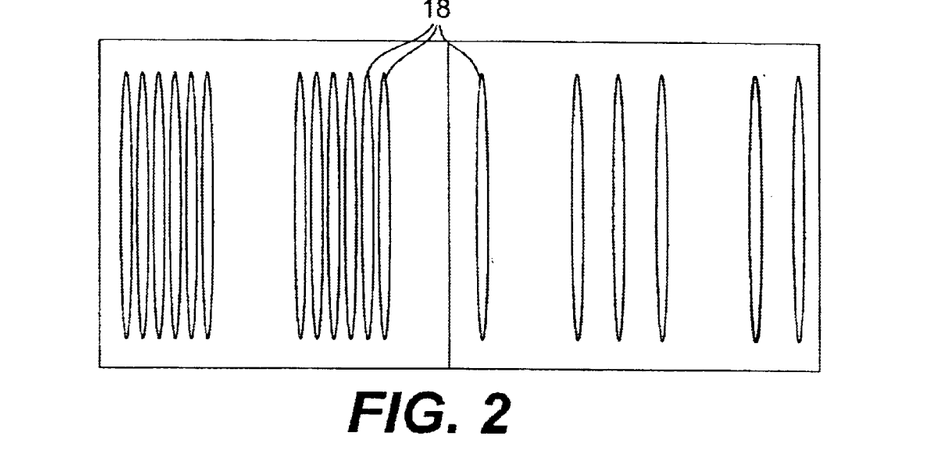
FIG. 2 illustrates marks printed in resist in accordance with exposures performed as illustrated in FIG. 1, FIG. 3 schematically illustrates the contour of a mark imaged onto a charge coupled device (CCD) imaging array.

Dense and isolated marks formed in this manner are illustrated in FIG. 2. Dense marks are ideally spaced from each other by a distance equal to the maximum width of the mark; that is, both the mark width and the mark separation is intended to be equal to the critical dimension. Marks spaced by a greater distance, generally many multiples of the critical dimension, are considered to be isolated marks. For some lithographic purposes not particularly relevant to the invention, it is considered that marks spaced by a distance of more than seven to ten times the lithographic exposure wavelength are isolated marks and those spaced closer than that distance are dense marks. However, there is no generally accepted specific transition between isolated and dense marks and it may be more useful for purposes of practice of the invention to consider dense marks as those most closely approx mating the dimensions and spacing of features of integrated circuit designs generally considered to be more densely integrated and uniform, such as memories, and isolated marks as those more closely approximating the features and spacings of integrated circuit designs having less uniform features and spacings (e.g. a spacing to CD ratio of 3:1 or greater) such as in logic arrays and processors. In any case, the nomenclature is not particularly important to the successful practice of the invention and it is considered very desirable and much preferred to form marks and spacings which closely mimic the dimensions and spacings of features in a given integrated circuit design to be produced in order to allow capture of data relevant to the pattern to be exposed. For much the same reasons, different illumination conditions (e.g. illumination sigma, numerical aperture and the like) will be found more appropriate for different respective integrated circuit designs and the performance of the imaging structure will be altered accordingly. Therefore, the exposure parameters (e.g. charged particle beam current and space charge density) appropriate to the pattern design is also preferably followed in the practice of the invention in order to obtain data for evaluation of behavior of the imaging structure under comparable conditions such that imaging system behavior is also comparable.

Figure 3:
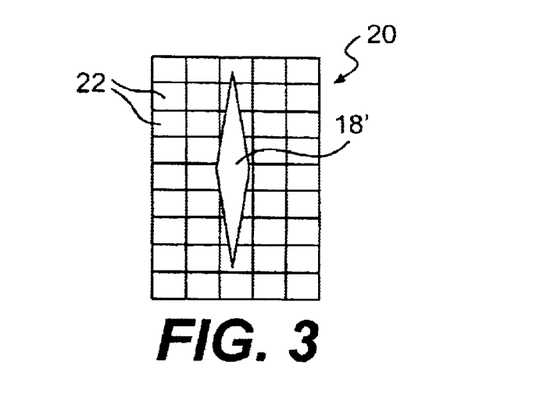

FIG. 3 illustrates the imaging (18') of a mark 18 on a charge coupled device (CCD) imaging array 20 which is widely known and used in the art and details of which are unimportant to the practice of the invention. It is sufficient to an understanding of a CCD array adequate for practice of the invention to observe that a plurality of detectors 22 of similar shape and area are arranged substantially contiguously in a regular array, preferably in the form of a matrix. Impingement of light causes a charge to be developed in each detector 22 proportional to the light flux incident thereon. Under control of a clock, the developed charge is then shifted out of the array along either columns or rows and reduced to a serial string of analog values in the order of a raster scan pattern covering the entire array. In general, sensors 22 will exhibit a slight variation in sensitivity which is referred to as fixed pattern noise; for which techniques of correction are well-understood in the art.

When an image 8' of a mark is projected (e.g. with an optical microscope) on a CCD array, the individual detectors 22 (which are exaggerated in size relative to the mark image 18' in FIG. 3 in the interest of clarity) will develop a charge proportional to the light flux incident thereon. In general, the charge will be proportional to the portion of the mark image 18' which coincides with the area of a particular sensor 22. However, it is not necessary for the image of the mark on the resist to be precisely focused and, in fact, additional information can be captured by measurement of the mark image at varying focus and depth of field corresponding to the illumination conditions of the imaging structure (which results in differing effective depth of field, as will be discussed in greater detail below.

The term "imaging structure" is used herein to collectively and generically refer to optical imaging/projection arrangements using electromagnetic energy, whether or not in the visible spectrum (e.g. deep ultraviolet, X-rays, etc.) as well as the magnetic and/or electrostatic analogs thereof for charged particle beams or any other exposure medium that may be used to selectively expose a pattern on a layer of resist for selective development. Accordingly, it is to be understood that the invention is applicable to measurement of the location of pattern features which may have been made by any of these exposure media or any others. By the same token, while broadband light in the visible spectrum is preferred for making measurements in accordance with the invention, other illumination media and sensor structures may also be employed as may be dictated by the dimensions and/or spacing of the mark(s).

Figure 4A:
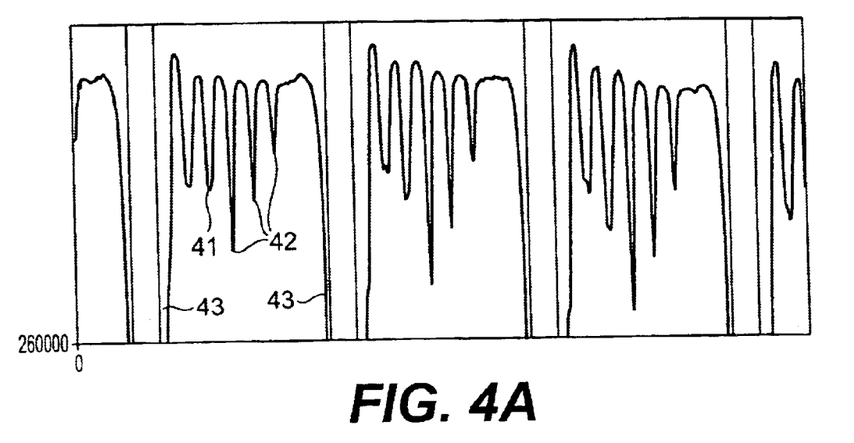
FIGS. 4A and 4B show comparative electrical signals output from CCD imaging array in the absence and presence of marks such as those illustrated in FIG. 2, respectively.
Figure 4B:
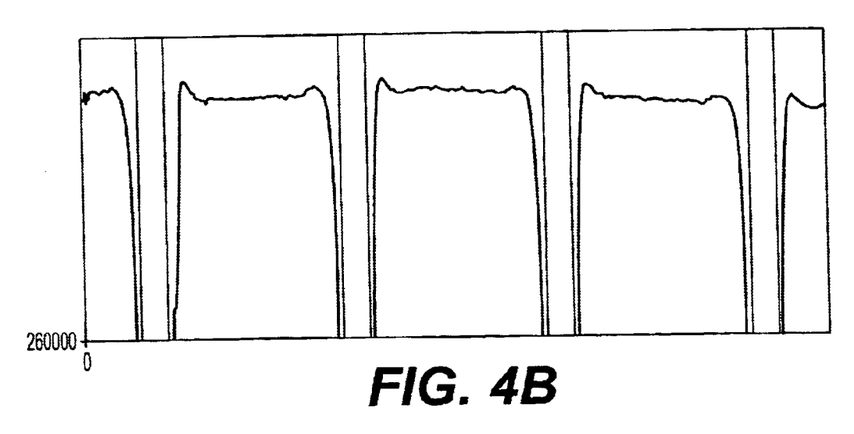

The irradiance distribution from a group of dense and isolated marks as detected by a CCD array is shown in FIG. 4A and a CCD output in the absence of marks is shown in FIG. 4B for comparison. In the preferred embodiment, the CCD output is summed column-wise over a plurality of rows of individual detectors 22 (although other analysis techniques in one or two dimensions such as cross-correlation can also be used); yielding peaks where more individual detectors produce an output signal. In the graph of FIG. 4A, the detection of the marks is clearly evident as negative-going peaks in the CCD output corresponding to different locations on the CCD array. Broad peaks 41 represent detection of groups of dense marks which are only marginally resolvable as indicated by a "notch" appearing n some peaks. Nevertheless, the broad peaks are well-defined and accurately represent the center of a group of dense marks (in this case, five marks. Narrow peaks 42 represent individual isolated marks. The difference in magnitude (and, to some degree, breadth) of the peaks in different groups corresponds to responses at differing focus positions since defocussing will broaden the mark image to be detected by additional sensors while reducing intensity at each individual sensor. Further, the difference in height of peaks in the same group reflects difference in CD between the test marks. Portions of the curves reaching the top and bottom of FIGS. 4A and 4B are artifacts resulting from the transition between metrology fields and are unimportant to the invention or an understanding of its principles.

While not particularly evident to the eye from FIG. 4A, some lateral shift in the peaks with focus is generally present, at least prior to adjustment and correction of the imaging structure of the lithographic tool. It is an underlying principle of the invention that aberrations in the imaging structure of a lithographic tool will be manifested as positional shifts in the location of features exposed by the tool (although the effects of different aberrations may be superimposed). Therefore, accurate measurement of position of features, as exposed by the tool across its image field (and using patterns and illumination conditions which closely follow those of the design to be produced, as facilitated by the invention) provides accurate characterization of the behavior of the imaging structure and trends which can support substantial correction or compensation for aberrations of the imaging structure and/or variations due to lithographic process non-uniformity (e.g. variations in resist thickness causing asymmetry of etching or deposition).

Figure 5:
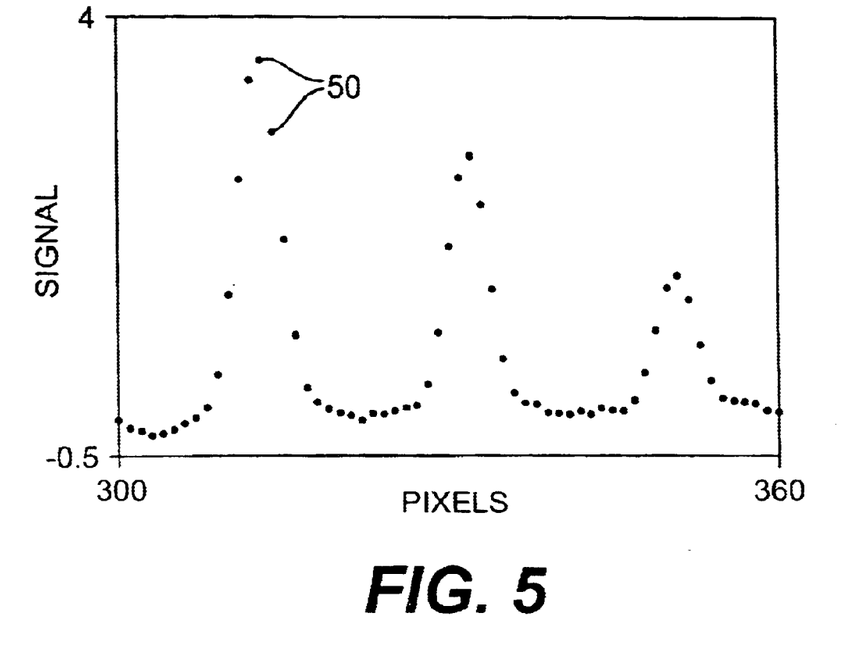
FIG. 5 shows a graph of a normalized signal of FIG. 4A.

FIG. 5 represents a portion of a graph similar to that of FIG. 4A illustrating the normalized e.g. by subtracting the signal depicted in signal 4A from the signal depicted in FIG. 4B to remove or reduce artifacts in the CCD microscope such as non-uniformity of illuminator.) CCD array output (signal strength) as a function of the pixel numbers or locations of individual sensors 22 (FIG. 3). In this case, three peaks for three different isolated marks are depicted. It should be noted that none of the discrete CCD output values 50 is at the peak for an individual mark; corresponding to the image 18' of a mark 18 not necessarily being aligned with a column of individual sensors 22, as shown in FIG. 3, as the effective scanning direction proceeds in the direction of rows. Such alignment is not required in accordance with the invention and, in any event, is impractical to achieve and provides no useful benefit since it is the function of the invention to measure extremely small deviations of relative position.

Figure 6:
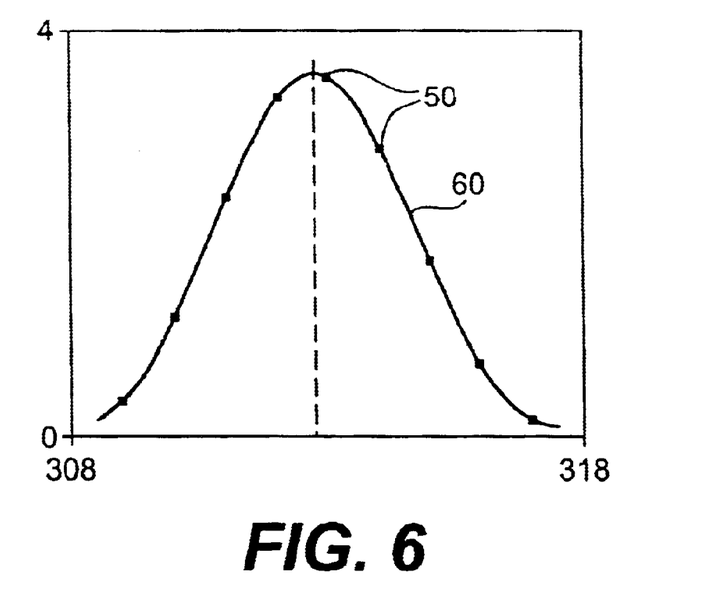
FIG. 6 illustrates fitting a graph such as that of FIG. 5 onto a mathematical function.

This small deviation in relative position can be determined rapidly and with extremely high precision by curve fitting as illustrated in FIG. 6 which shows superposition of a $SINC^2$ curve 60 on the discrete data points 50 of the left peak of FIG. 5. Data processing algorithms for fitting curves that can be represented by mathematical functions are well-known and widely used in the art and details thereof are unimportant to the practice of the invention. The $SINC^2$ function illustrated may be expressed mathematically as $y=(\sin^2 \alpha)/\alpha^2$ and is generally used to describe diffraction effects. However it should be understood that other mathematical functions, (e.g. Gaussian, Bessel, and other functions having a well-defined maximum/extreme) may be used as well. It is beneficial at low signal-to-noise ratios to use a derivative approach to finding signal maxima as is well-understood in the art. Whatever function is used, the best fit to the captured data points will yield a location of (the axis of) the mark to an accuracy of about 0.5 to 1.0 nm; a very small fraction of the critical dimension or pitch of sensors 22 on the CCD (generally about 300 nm). That is, the position or relative position and shifts therein with focus, exposure dose, illumination sigma, etc. are measured in pixels (or fractions thereof) which can be calibrated relative to the critical dimension or any other convenient unit. This function may be enhanced to substantially any desired degree by magnification of the mark image 18' as imaged to the CCD array as shown in FIG. 3. The effectiveness of the invention to capture data by which the imaging structure can be characterized is shown in FIGS. 7A and 7B as will now be discussed.

Figure 7A:
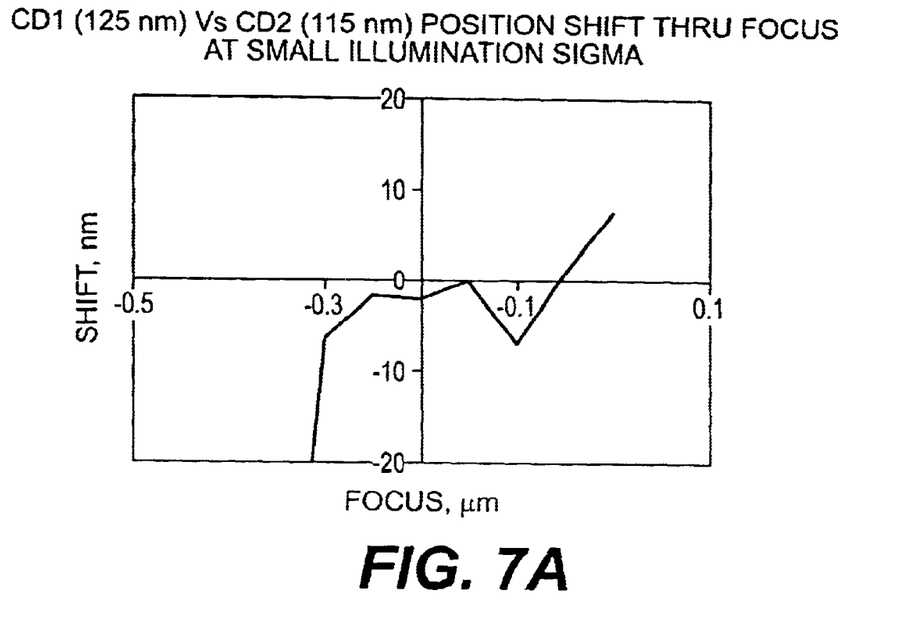
FIGS. 7A and 7B illustrate position shift with shift of focus at different illumination sigmas and focus levels of the imaging structure of a lithography tool.
Figure 7B:
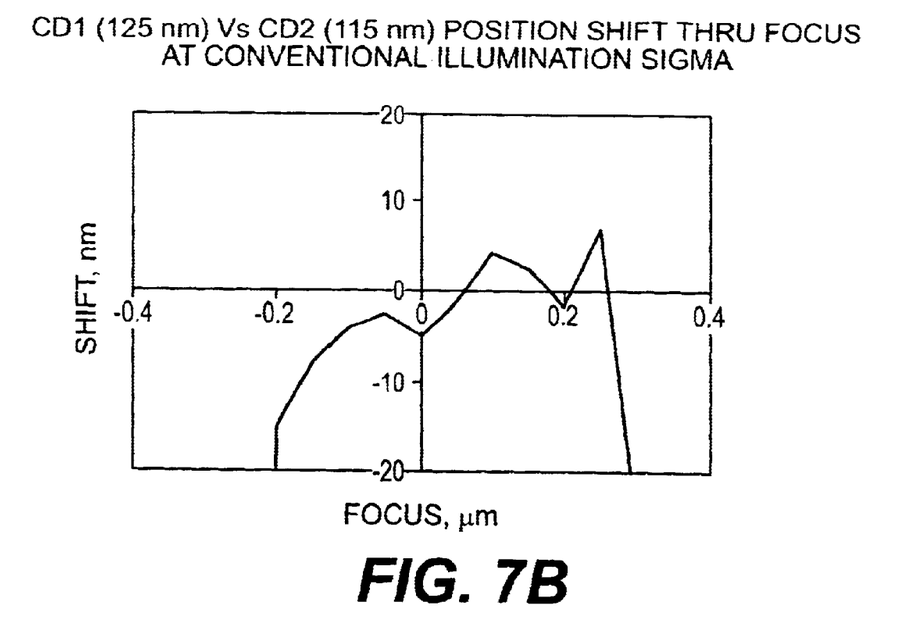

Specifically, FIG. 7A shows detection of shifts in relative position of marks over a range of about 30 nm with a resolution accuracy within much less than 1.0 nm with focus shifts over a range of about 0.5 μm, even at a low illumination sigma corresponding to a large depth of field. Similar but more pronounced position shifts with focus are seen in FIG. 7B at a more conventional illumination sigma and depth of field. Accordingly, it can be seen that the invention supports measurement and imaging structure adjustment and optimization to well below 1% of the CD of interest in current integrated circuit designs and thus the invention will support measurements corresponding to a small fraction of foreseeable minimum feature size regimes. Further, the invention is clearly capable of capturing data at increased speed which is sufficient to characterize aberrations of imaging structures of lithographic tools to a small fraction of the dimensions of features which can be imaged by the too. Thus, operation of the invention in real time for purposes of adjustment of the imaging structure and for overlay registration alignment can be performed in real time, if desired.

Figure 8A:
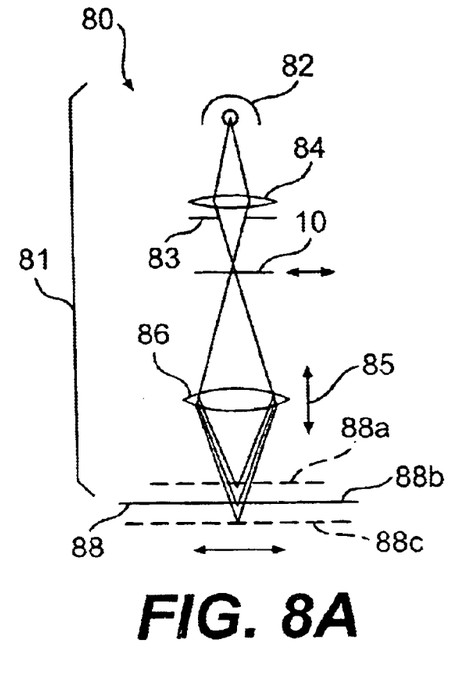
FIGS. 8A, 8B and 8C are schematic depictions of suitable apparatus for practice of the invention illustrating a preferred form of practice of the invention.
Figure 8B:
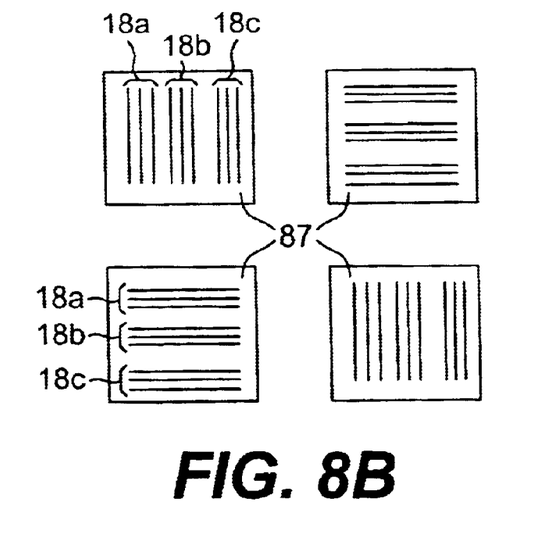
Figure 8C:
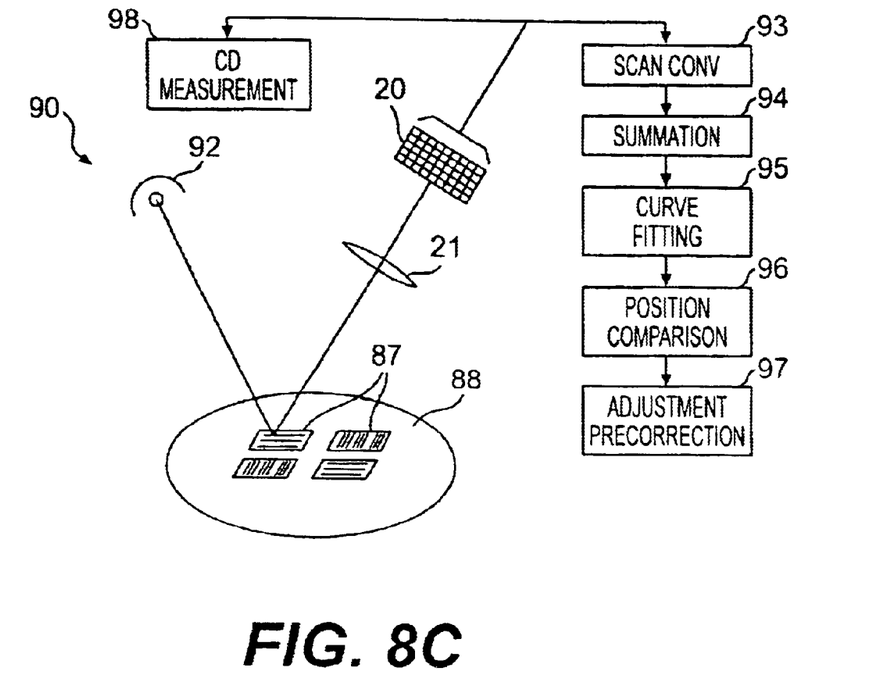

Referring now to FIGS. 8A–8C a preferred methodology for practice of the invention will be described in connection with schematic depictions of suitable apparatus therefor. A lithography exposure tool 80 is schematically illustrated in FIG. 8A in a simplified form in the interest of clarity. An exposure medium source 82 is provided which may be of any type that emits energy or particles to which a lithographic resist is sensitive (e.g. visible or ultraviolet light, and electron beam or the like). A lens arrangement 84 appropriate to the exposure medium (e.g. mirror optics for deep ultraviolet, magnetic lens for electron beams, etc.) is provided to image source 82 at a reticle 10 including one or more pairs of patterns of CD width (which may differ between the respective lines 12, 14 of a pair) such as are shown in FIG. 1. It is preferred to provide at least two pairs of lines (or other configuration such as "V" or "L" shaped patterns) be provided in orthogonal orientation to each other since positional shift is detected in accordance with the invention in a direction orthogonal to the long axis of marks 18 and information concerning all positional shifts is desirable. The reticle 10 is preferably mounted on a translation table or stage so that images of different reticle apertures car be superimposed by multiple exposures as discussed above in connection with FIG. 1. The illumination conditions of the imaging structure 81 may be controlled, if desired, with a suitably located iris or diaphragm schematically indicated at 83.

The image of reticle objects (e.g. 12, 14) are imaged to a resist coated target 88 by lens arrangement 86 (similarly appropriate to the exposure medium) which is preferably provided with a focus arrangement schematically depicted by double arrow 85. As alluded to above, it is preferred to produce a plurality of theoretically identical patterns of marks 18a, 18b, 18c at different focus planes 88a, 88b, 88c (but imaged on a single target plane 88) to form a metrology field 87, as shown in FIG. 8B. A plurality of metrology fields of marks are provided across the exposure field of the lithography tool. Aberrations in the imaging structure 81 will then appear as variations in position and/or relative position of the marks both within a single metrology field 87 and from metrology field to metrology field across the exposure field of the tool. The details of the focus arrangement are unimportant to the practice of the invention and, in fact, field curvature of the imaging structure 81 which will usually be present, at least prior to adjustment or correction of the imaging structure in accordance with the invention, could be exploited for the purpose.

FIG. 8B is an exemplary group of metrology fields 87 which, in some applications of the invention such as for calibration using a test wafer (e.g. 88b), preferably extend across the entirety of the target or exposure field of the tool. It should be appreciated that the metrology fields may be very small, particularly in the direction of the CD of the marks, and thus may be placed on scribe lines, dicing kerfs and the like of a production wafer which are consumed when the wafer is divided into separate chips. Thus, the performance of the imaging structure can be monitored on production wafers (also represented by 88b) and used for overlay alignment as will be discussed in greater detail below. For example, the evaluation of test marks formed on one production wafer can be used to confirm, refine or readjust the imaging system for a following production wafer. On a test wafer, the small size of the metrology fields allows measurement of aberrations in both coordinate directions at very fine pitch to support very thorough analysis and correction across the exposure field.

Different mark orientations in respective metrology fields allow detection of any direction of shift of mark image with focus and/or with location in the exposure field of the tool. It should be appreciated that the marks 18a–18c may be either formed in developed resist or may be actual features (after a patterned resist is removed) formed by etching, deposition or other processes in or on the target wafer in accordance with a resist pattern. Thus the invention can be used to measure the overall results of an entire lithographic process as well as the performance of a lithographic exposure tool. These shifts of position are preferably detected in a manner schematically depicted in FIG. 8C.

As depicted in FIG. 8C an energy source 92 such a broadband or monochromatic light is provided. The type of energy is not critical to the practice of the invention except that the wavelength(s) should be chosen in accordance with the pitch of marks so that diffraction effects can be avoided or appropriately considered or compensated in the resulting data and processing thereof. Energy reflected from or absorbed by the marks in the metrology fields 87 and the wafer/target 88, respectively, is imaged by a lens arrangement such as an optical microscope schematically depicted at 21 onto a CCD array 20 which is preferably provided in the form of a television-type camera. The output of the CCD array is developed as a serial stream of analog values which may be converted to digital values as may be considered convenient. Different mark orientations may be accommodated by reordering the serial data stream in the manner of a scan conversion process 93; many suitable forms of which are known to those skilled in the art.

Summation (or other analysis techniques alluded to above) of the CCD output values is then performed at 94, resulting in data such as is depicted in FIG. 4, discussed above. A suitable mathematical function is then fitted to each peak in the resulting data as discussed above in connection with FIG. 6 and depicted at 95 of FIG. 8C to determine a location or relative location of an isolated mark or group of dense marks. Some data concerning aberrations may also be discernible from other data trends such as the width of peaks at different focus distances and depth of field/illumination sigma. The relative positions of marks or groups of marks is then compared within and between metrology fields and relative position shifts of marks are determined as depicted at 96 to allow analysis and adjustment, correction, compensation and/or precorrection of a reticle to minimize or eliminate aberrations of the imaging structure as depicted at 97.

It should be appreciated that the optical system of FIG. 8C is substantially the same as that used for measurement of CD in the above-incorporated U.S. patent application and has proven robust, consistent and of high sensitivity and accuracy to capture large amounts of information at high speed. However, the processing of data in accordance with the present invention is much different and allows detection of position variation of a small fraction of a nanometer, as discussed above, from which aberrations can be characterized. Additionally it should be appreciated that the process of the above-incorporated application and the present invention can be carried out concurrently from the same CCD output data, as depicted at 98 to even more fully characterize tool and/or process performance.

It should also be appreciated that the exposure process and arrangement of FIG. 8A is completely independent of the detection process and arrangement FIG. 8C but common elements may be used and/or the processes may be performed concurrently using light source 82 rather than a separate source 92 but possibly utilizing a different wavelength to avoid exposure of a resist, if present. That is, for example, the illumination of an earlier formed mark with a projected reticle image (e.g. 12, 14) will produce a strong and readily detectable effect as the reticle image is brought into registration with the mark and a portion of the illumination pattern becomes partially coincident with dimensions of the mark. Other arrangements will be evident to those skilled in the art. Such an expedient will allow adjustments to be made in real time, either manually or automatically, using features of dimensions comparable to the CD of interest and at an accuracy of a small fraction of the CD. This capability of the invention is particularly convenient for performing overlay adjustments.

Figure 9:
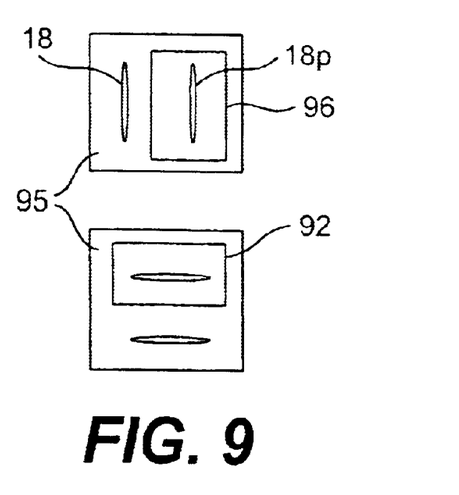
FIG. 9 illustrates an exemplary technique for application the invention of the invention to overlay processing.

Referring now to FIG. 9, application of the invention to overlay processes will now be discussed. As alluded to above, current overlay alignment or registration measurement techniques are generally performed by optical inspection using relatively large marks which limit the capture of information relevant to the accuracy with which overlay may be accomplished. Fundamentally, large marks inherently obscure (e.g. are not affected by) aberration of the imaging structure while overlay processes are often performed on different tools exhibiting different aberration characteristics. The marks also require space on the wafer that may limit the number of chips that can be formed thereon. Perhaps more importantly, the larger registration marks now currently in use (or at least operative regions thereof) must be separated from the chip areas by a substantial distance and overlay alignment errors may derive from aberrations occurring over such a distance. All of these deficiencies of currently used overlay processes are overcome by application of the invention thereto.

FIG. 9 shows a pair of exemplary metrology fields 95 allowing application of the invention to overlay measurement processes. All that is necessary for application of the invention to overlay processes is the provision of a test mark 18 in the current level or process provided as discussed above and some provision allowing detection of a test mark 18p formed in a previous process such as a lithographically formed window 96 in, for example, a resist. Other configurations and arrangements answering these criteria will be evident to those skilled in the art such as direct superposition of marks 18, 18p by adjustment in real time using an illumination source 82 of FIG. 8A in the detection process and arrangement depicted in FIG. 8C (but possibly of a different wavelength or medium to which a resist, if present, is insensitive). The spacing of marks 18 and 18p can then be detected as discussed above and adjustments made to achieve overlay accuracy to a small fraction of the CD (which is essentially of the same accuracy as that allowed by any residual aberrations in the imaging system after correction in accordance with the invention). This accuracy clearly supports avoidance of variation in electrical performance from wafer to wafer.

The effects of this accuracy are enhanced by the fact that the metrology fields 95 can be made very small and located on scribe lines, dicing kerfs and the like which are consumed by separation of the wafer into chips as is preferred, where possible, in current practice so that, in effect, no wafer space is required. More importantly, such location of the overlay metrology fields 95 allows them to be closely proximate or even directly adjacent to the edge of a chip and the location of elements of the integrated circuit. This proximity supports avoidance of variation of electrical properties of individual elements from chip to chip and within a chip. Alternatively, while some chip space would be required, it is possible to place such metrology fields within the chip area if the criticality of overlay alignment warrants such placement.

In view of the foregoing, it is seen that the invention provides a method and apparatus for extremely accurate and high speed automated measurements which support analysis of aberrations of an imaging structure of a lithography tool and adjustment for avoidance or minimization thereof and in real time, if desired. The invention is applicable to marks formed in either a developed patterned resist or on a processed wafer, allowing assessment and correction of either the lithographic tool performance or the performance of an overall lithographic process and to all types of lithographic exposure tools. The invention may also be applied to overlay measurement processes with an accuracy which supports avoidance of alteration of electrical properties of integrated circuit elements from wafer to wafer and from chip to chip on a single wafer.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A method for measuring position of features corresponding to a lithographic exposure, said method including steps of forming marks on a surface by overlapping exposure of features, imaging said marks to a sensor array to derive an output signal representing image intensity at respective locations across said sensor array, and fitting a mathematical function to respective portions of said output signal corresponding to images of said marks to determine a location of respective ones of said marks.

2. A method as recited in claim 1, including the further step of projecting patterns at different focus distances to form said marks on said surface, and comparing relative locations of marks formed at said different focus distances.

3. A method as recited in claim 1, wherein said marks represent different critical dimensions.

4. A method as recited in claim 1, wherein said features are formed of reticle patterns of angled lines.

5. A method as recited in claim 4, wherein said reticle patterns are of different critical dimensions.

6. A method as recited in claim 1, including the further step of concurrently performing a measurement of critical dimensions of said marks.

7. A method as recited in claim 1, wherein said imaging step includes the further step of summing said output signals along at least one coordinate direction of an exposure field.

8. A method as recited in claim 1, including the further step of adjusting an imaging structure of a lithographic tool for making said lithographic exposure.

9. A method as recited in claim 8, wherein said adjusting step includes adjustment of overlay alignment.

10. A method as recited in claim 1, wherein said test marks are located at regions of the wafer which are consumed by separation of chips.

11. A method as recited in claim 1, wherein said mathematical function is one of a SINC² function, a Gaussian function and a Bessel function.

12. A method as recited in claim 1, wherein said marks are formed in a resist.

13. A method as recited in claim 1, wherein said marks are formed on a wafer by an etching or deposition process.

14. An apparatus for measuring placement or relative placement of image features by the imaging structure of a lithographic exposure tool, said apparatus comprising
- a sensor device for developing an output signal representing a distribution of energy from a test mark pattern formed of overlapping features,
- a processor for fitting a mathematical function to respective portions of said output signal corresponding to a test mark of said test mark pattern to determine a location of a said test mark.

15. Apparatus as recited in claim 14, wherein said processor further performs
- measurement of a critical dimension of said test mark.

16. Apparatus as recited in claim 14, wherein said processor further performs summation of said output signal along a coordinate direction.

17. Apparatus as recited in claim 16, further including
- a scan converter for summation of said output signal along another coordinate direction.

18. Apparatus as recited in claim 14, wherein said processor further performs comparison of locations of test marks in different metrology fields.

19. Apparatus as recited in claim 14, wherein said processor further performs comparison of locations of test marks formed in different lithographic processes.

20. Apparatus as recited in claim 14, wherein said processor further performs
- a derivative approach to determine said location of said test mark.

21. A method of producing chips on a wafer using a lithographic exposure, said method including steps of
- forming marks defined by overlapping exposed features on said wafer,
- imaging said marks to a sensor array to derive an output signal representing image intensity at respective locations across said sensor array,
- fitting a mathematical function to respective portions of said output signal corresponding to images of said marks to determine a location of respective ones of said marks, and
- adjusting an imaging structure of a lithographic tool for making said lithographic exposure.

22. A method as recited in claim 21, including the further step of
- protecting patterns at different focus distances to form said marks on said surface, and
- comparing relative locations of marks formed at said different focus distances.

23. A method as recited in claim 21, wherein said marks are formed by separate overlapping exposures of reticle patterns.

24. A method as recited in claim 23, wherein said reticle patterns are of different critical dimensions.

25. A method as recited in claim 21, including the further step of
- concurrently performing a measurement of critical dimensions of said marks.

26. A method as recited in claim 21, wherein said adjusting step includes adjustment of overlay alignment.

27. A semiconductor wafer including
- a semiconductor integrated circuit pattern formed thereon, said integrated circuit pattern including features having a first critical dimension, and
- a plurality of test field patterns, said test field patterns having test marks including features having a second critical dimension, said second critical dimension approximating or being representative of said first critical dimension.

28. A semiconductor wafer as recited in claim 27, wherein in a test field pastern is located within said semiconductor integrated circuit pattern.

29. A semiconductor wafer as recited in claim 27, wherein in a test field pattern is located adjacent said semiconductor integrated circuit pattern.

30. A semiconductor wafer as recited in claim 27, wherein in a test field pattern is located on a portion of the wafer consumed when said wafer is diced into chips.

* * * * *